US010008369B2

(12) United States Patent
Goodyear et al.

(10) Patent No.: US 10,008,369 B2
(45) Date of Patent: Jun. 26, 2018

(54) CYCLICAL PLASMA ETCHING

(71) Applicant: Oxford Instruments Nanotechnology Tools Limited, Oxon (GB)

(72) Inventors: Andrew L. Goodyear, North Somerset (GB); Michael J. Cooke, Bristol (GB)

(73) Assignee: Oxford Instruments Nanotechnology Tools Limited (GB)

( * ) Notice: Subject to any disclaimer, the term of this patent is extended or adjusted under 35 U.S.C. 154(b) by 0 days. days.

(21) Appl. No.: 15/248,853

(22) Filed: Aug. 26, 2016

(65) Prior Publication Data

US 2017/0069469 A1    Mar. 9, 2017

(30) Foreign Application Priority Data

Sep. 3, 2015    (GB) .................................. 1515622.7

(51) Int. Cl.
*H01L 21/302*    (2006.01)
*H01J 37/32*    (2006.01)
*C23C 16/02*    (2006.01)
*H01L 21/3065*    (2006.01)

(52) U.S. Cl.
CPC .... *H01J 37/32449* (2013.01); *C23C 16/0245* (2013.01); *H01J 37/32082* (2013.01); *H01J 37/32174* (2013.01); *H01J 37/32422* (2013.01); *H01L 21/30655* (2013.01); *H01J 2237/334* (2013.01)

(58) Field of Classification Search
CPC .......... H01J 37/32174; H01J 37/32422; H01J 37/32449; H01L 21/30655; C23C 16/0245; C23F 4/00
USPC ....... 438/706, 710, 712, 719, 720, 723, 736; 216/58, 67
See application file for complete search history.

(56) References Cited

U.S. PATENT DOCUMENTS 4,756,794 A    7/1988  Yoder
8,617,411 B2   12/2013 Singh
(Continued)

OTHER PUBLICATIONS

D. J. Economou, "Pulsed Plasma Etching for Semiconductor Manufacturing", Journal of Physics D: Applied Physics, vol. 47, Jan. 7, 2014, pp. 303001-303027.

*Primary Examiner* — Lan Vinh
(74) *Attorney, Agent, or Firm* — Blank Rome LLP

(57) ABSTRACT

There is provided an apparatus for cyclical plasma etching of a substrate, the apparatus comprising: a process chamber; a support within the process chamber for receiving the substrate to be etched; a controller for repeatedly applying a dosing step and a bombardment steps respectively; a dosing controller for controlling the flow of a process gas in the dosing step such that the substrate is exposed to a maximum dose of process gas in use of 1000 Langmuirs and said dose is controllable within an accuracy of 1 Langmuir; and a first signal generator coupled to the process chamber and a second signal generator coupled to the support within the process chamber, the first and second signal generators being configured such that in use positions ions of an plasma active species within the process chamber have a substrate bombardment energy in the range of 10 eV to 100 eV which is controllable within an accuracy of 5 eV. There is also provided a method for cyclical plasma etching of a substrate using said apparatus.

9 Claims, 6 Drawing Sheets

(56) References Cited

U.S. PATENT DOCUMENTS

| | | | |
|---|---|---|---|
| 2006/0144518 A1* | 7/2006 | Kaji | H01J 37/32082 156/345.43 |
| 2007/0163994 A1 | 7/2007 | Rauf et al. | |
| 2011/0139748 A1 | 6/2011 | Donnelly et al. | |
| 2011/0192820 A1 | 8/2011 | Yeom et al. | |
| 2012/0252141 A1* | 10/2012 | Sundararajan | H01J 37/32082 438/5 |
| 2015/0017809 A1 | 1/2015 | Bhowmick et al. | |
| 2015/0064924 A1* | 3/2015 | Takaba | H01L 21/0276 438/717 |
| 2015/0118858 A1* | 4/2015 | Takaba | H01L 21/31116 438/719 |

* cited by examiner

DC bias developed at the table v RF power to the table, for plasma source power zero, 200W and 500W. Approximate regimes for cyclical plasma etching and for standard plasma etching are identified.

Etch rate of amorphous Silicon (above) and Silicon dioxide (below) in Angstroms per cycle v DC bias during the bombardment step.

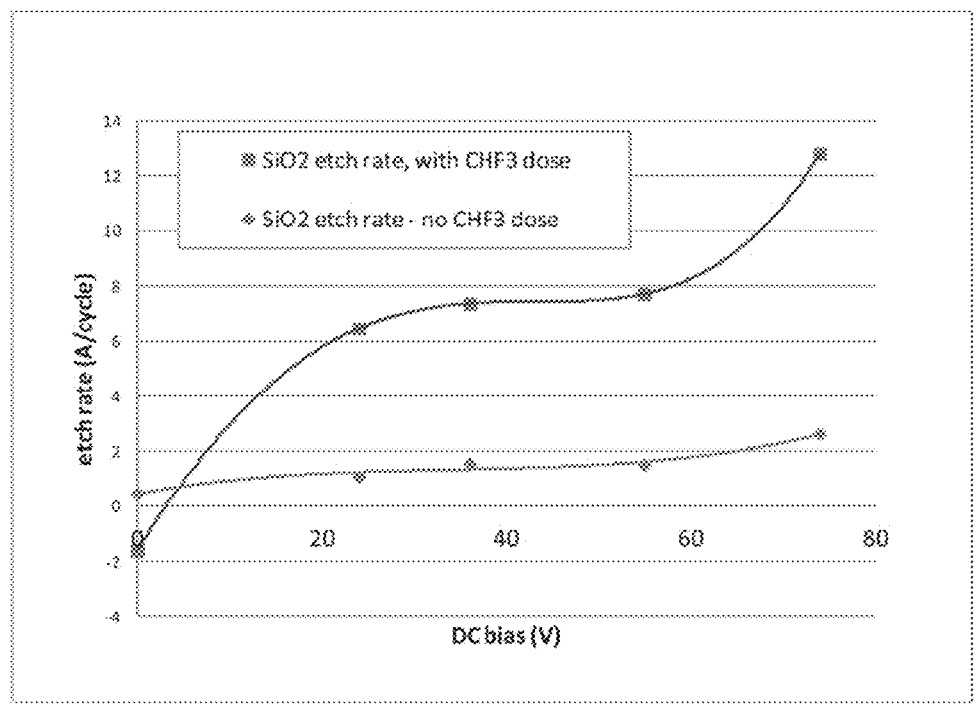
Figure 5 SiO₂ etch using cyclical etching, with and without a CHF₃ gas dose

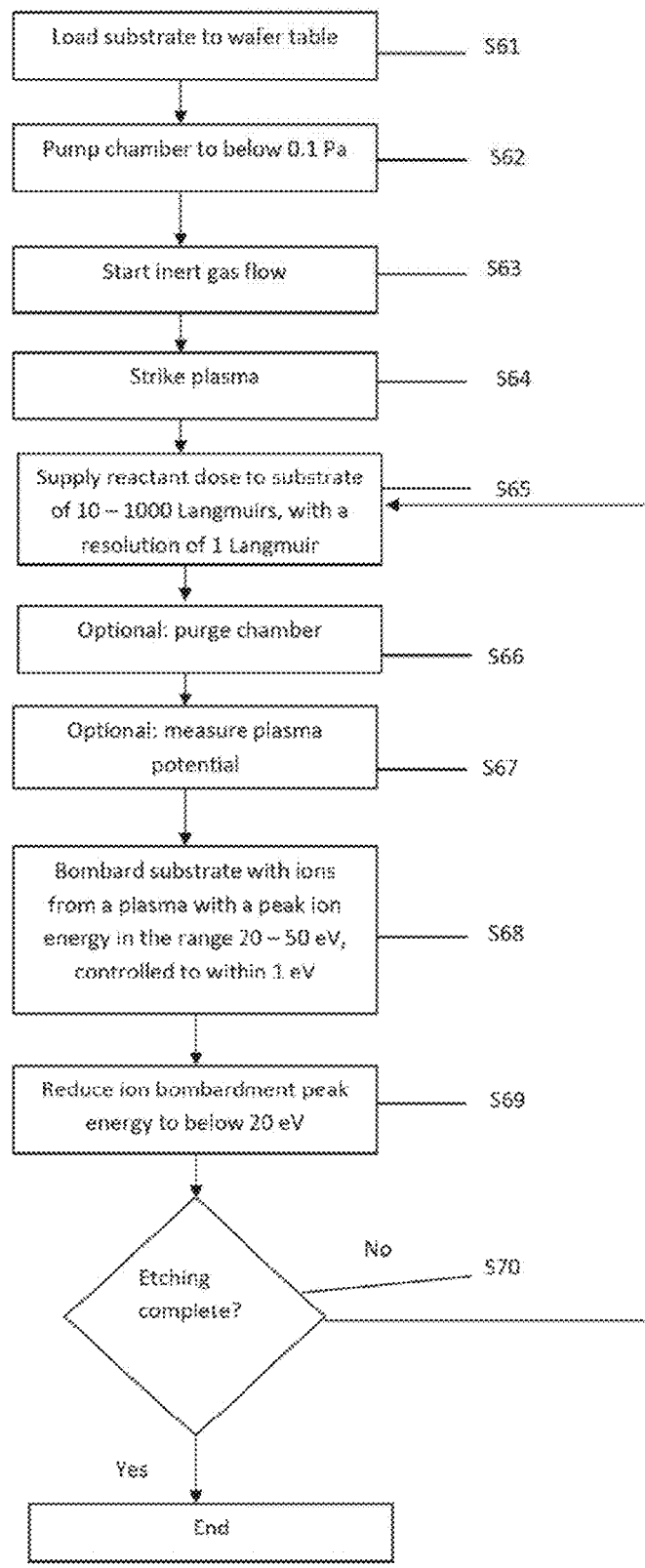

CYCLICAL PLASMA ETCHING

RELATED APPLICATIONS

This application claims the benefit of Great Britain Patent Application No. 1515622.7, filed Sep. 3, 2015. The contents of that application are hereby incorporated by reference.

TECHNICAL FIELD

The present invention relates to an apparatus for cyclical plasma etching and a method thereof, and in particular but not exclusively, it relates to an apparatus and method for cyclical plasma etching that enables very thin layers, even single atomic layers, to be etched precisely with minimal disruption to the underlying substrate material.

BACKGROUND

Some layers of materials used in microelectronic and nanoelectronic devices have become extremely thin in recent years, almost to the point of atomic monolayers. For example, in the class of two-dimensional materials, graphene, hexagonal boron nitride and transition metal dichalcogenides are in some cases made of single atomic layers. However, creating useful devices of such small dimensions requires careful patterning and removal of each layer.

Plasma etching is an established method for etching layers in microelectronics. However, although many advances in conventional plasma etching have increased the productivity of known methods by increasing the etch rates, such techniques remain inappropriate for etching extremely thin layers. Furthermore, in conventional plasma etching, the surface of the substrate is often disrupted to a depth of several atomic layers by ion bombardment.

Atomic layer etching techniques (also known as "layer-by-layer dry etching" or "digital etching") have been developed, which use self-limiting behaviour to remove thin layers of material. Such techniques involve a cycle of formation of a surface layer of partially reacted material in a first step and then removal of just the partially reacted material in a second step.

In one example of a known atomic layer etching technique, doses of chlorine gas are introduced alternately with argon ion bombardment from a shuttered electron cyclotron resonance plasma source. In another known technique based upon plasma etching, it was shown that the window for self-limiting behaviour is very narrow and that changing the DC bias of a radio frequency biased wafer table by just a few volts is sufficient to move between atomic layer etching and conventional etching regimes. Thus, it has also been proposed to precisely control the DC bias on the wafer table either through variation of the magnetic field in magnetically enhanced reaction ion etching or by the use of a complex non-sinusoidal wafer bias scheme.

Subsequently, it has been suggested to use cyclical pulsing schemes, for example with auxiliary electrodes or for example with pulse-biased boundary electrodes to manipulate the plasma potential of an afterglow from a pulsed induction coupled plasma. However, the auxiliary electrode scheme adds complexity and cost to the process chamber. Furthermore, attempts have been made to use the well-defined energy of certain metastable species to drive plasma etching. In some cases, an energetic neutral beam derived from a plasma source has been used for surface excitation in atomic layer etching. In other cases, a cyclical plasma bombardment method has been used for part of a cycle in a self-limiting etch scheme.

However, not one of the above-mentioned etching techniques provide a sufficiently reliable or consistent approach that allows very thin layers of material to be removed.

SUMMARY OF THE INVENTION

The present inventors have recognised that an improved and more precise method for atomic layer etching and an apparatus to perform said method are needed.

Thus, in accordance with a first aspect of the present invention, there is provided an apparatus for cyclical plasma etching of a substrate, the apparatus comprising: a process chamber; a support within the process chamber for receiving the substrate to be etched; a controller for repeatedly applying a dosing step and a bombardment step respectively; a dosing controller for controlling the flow of a process gas in the dosing step such that the substrate is exposed to a maximum dose of process gas in use of 1000 Langmuirs and said dose is controllable within an accuracy of 1 Langmuir; and a first signal generator coupled to the process chamber and a second signal generator coupled to the support within the process chamber, the first and second signal generators being configured such that in use positive ions of a plasma active species within the process chamber have a substrate bombardment energy in the range of 10 eV to 100 eV which is controllable within an accuracy of 5 eV.

The apparatus of the present invention provides the means for effecting multiple cycles of dosing and bombardment of a substrate so that a very thin layer, for example, an atomic layer, of the substrate may be removed in each cycle. While prior known techniques have focused on achieving automatically self-limiting etching behaviour, the present invention is directed towards the underlying challenge of controlling the apparatus such that a first material of the substrate is etched whilst a second underlying material of the substrate is essentially unperturbed. In a first dosing step, a process gas is introduced into the process chamber, said process gas being unexcited or plasma-excited before it reaches the substrate, and said process gas may react or partially react with the surface of the substrate, be adsorbed on its surface, or deposit a thin layer on the surface. In a second bombardment step, material is etched away from the substrate surface, and the material that is removed is substantially from the upper first material of the substrate. The bombardment step may act to remove partially reacted material that is formed during the dosing step, or it may act by stimulating a reaction between adsorbed gas or a deposited layer and the first substrate material to create a volatile species containing atoms of the substrate first material.

In the present application, the term "Langmuir" is defined as a unit of exposure or dose of gas to a surface that is the multiplication of the pressure of the process gas by the time of exposure; 1 Langmuir corresponds to an exposure of $1 \times 10^{-6}$ Torr for one second (or about $133.3 \times 10^{-6}$ Pa for one second). 1 Langmuir equates to coverage of about one monolayer of adsorbed gas molecules on a surface under the assumption that every gas molecule that reaches the surface undergoes adsorption, i.e. the sticking coefficient is 1. In practice, the sticking coefficient may vary depending on the reactivity of the surface and the gas molecules respectively, hence, the unit of the Langmuir gives a lower limit of the dose required to achieve a monolayer of adsorbed gas molecules on the surface.

Since the substrate is exposed to a controlled amount of process gas at each the dosing steps (i.e. up to a maximum dose of 1000 Langmuirs), it is possible to ensure that a reproducible amount of process gas reacts with (for example, by adsorption) the surface of the substrate. It is advantageous to minimise the amount of process gas in the process chamber during the relatively energetic bombardment step because this reduces the likelihood of driving conventional plasma etching or sputtering in this step; conventional plasma etching or sputtering would involve limited selectivity between the different types of material and so is it likely that more than only the reacted or partially reacted or adsorbed or deposited layer is removed.

It may therefore be preferable for the mass flow controller to control the flow of process gas in the dosing step such that the substrate is exposed to a maximum dose of process gas in use of 100 Langmuirs, and more preferably a maximum dose of process gas in use of 10 Langmuir and yet more preferably a maximum dose of process gas in use of 1 Langmuir, said dose being controllable within an accuracy of 1 Langmuir. A dose of 1 Langmuir with a sticking coefficient of unity would advantageously result in a monolayer of reacted surface of the substrate after the dosing step is complete and so this allows a very thin layer of material to be etched in the bombardment step to be created in a controllable and precise manner. Higher doses up to 1000 Langmuirs of the adsorbed or deposited species are used where the sticking coefficient is lower than unity.

In order to further minimise the amount of process gas in the process chamber during the bombardment step, although the plasma active species in the bombardment step may be generated from the process gas or from a gas mixture comprising the process gas, it may be preferable that the plasma active species for the bombardment step is generated from a gas other than the process gas, hereinafter referred to as the "background" gas. Said background gas may be introduced to the process chamber in a constant flow at a suitable pressure. Alternatively, said background gas may be introduced into the process chamber after the dosing step. It may be preferable to use background gas flow and pressure values that are perturbed only a little during the dosing step, in order to reduce the likelihood of extinguishing the plasma during transitions between the dosing and the bombardment steps respectively.

The plasma active species is generated as a result of activation of each of the first and second signal generators. Preferably, the first signal generator coupled to the process chamber mainly determines the degrees of dissociation and ionisation of the gas, and the second signal generator coupled to the substrate support mainly determines the ion bombardment energy at the substrate. In other words, the first signal generator may preferably be for generating a plasma active species comprising positive ions within the process chamber and/or the second signal generator coupled to the support within the process chamber may preferably be for applying a bias on the support in the bombardment step. By controlling the power of each of said generators, it is possible to accurately control the bombardment energy at the substrate of the plasma active species that is generated. The first and/or second signal generators may be operated such that one or each are activated at the beginning of each bombardment cycle. Alternatively, the first and/or second signal generators may be operated such that one or each are powered on continuously so that the plasma is continuously generated in the process chamber and major changes in plasma source power and/or working pressure are avoided. It is preferable that the first and/or second signal generators are radio frequency generators that generate radio frequency signals. One or each of said signal generators may be conventional and commercially available 13.56 MHz generators or 2 MHz generators. In a particularly preferred example, the first RF signal generator may be continuously powered on and the second RF signal generator may be operated such that it is powered on only during the bombardment step.

The peak positive ion bombardment energy at the substrate may preferably be controlled within an accuracy of 1 eV, wherein both support potential and the plasma potential are measured. The second signal generator may preferably be controlled to deliver a first support bias power of at least 300 W in one arrangement and also a second support bias power of below 10 W with an accuracy of 0.1 W in another arrangement, so that the apparatus can also be used for conventional plasma etching. The bias power of the second signal generator may be controlled using an attenuator, as will be described below.

The process gas that is introduced to the process chamber may comprise a single type of gas molecule or it may be a mixture of different gases; the process gas may be one or more gases selected from the group consisting of: bromine (Br), hydrogen bromide (HBr), chlorine (Cl), hydrogen chloride (HCl), fluoroform ($CHF_3$) and other volatile fluorocarbon compounds. The background gas may preferably be an inert gas such as argon (Ar), oxygen ($O_2$), hydrogen ($H_2$) or nitrogen ($N_2$) that dissociates or ionises in response to signals from the first signal generator in use. The plasma active species may further comprise radicals and/or neutral chemical species or atoms as well as positive ions. The substrate layer to be etched may be silicon, a compound semiconductor such as GaAs or InP and their ternary and quaternary compounds with other elements (as used in microelectronic devices), a two-dimensional material such as graphene, hexagonal boron nitride, or a transition metal dichalcogenide. The underlying material which is substantially unperturbed by the process may be a different material from the same list.

It may be preferable to perform at least three cycles of dosing and bombardment steps respectively using the apparatus for cyclical plasma etching in order to clear any native oxide from the surface before etching the thin first layer. The number of cycles can be increased to etch a required amount of material. The apparatus can be used to etch a thicker layer down to a critical interface, starting with conventional plasma etching and changing to cyclical precision etching as the interface is approached. Beneficially, the apparatus may further include a detection system such as ellipsometry, interferometry or optical emission spectroscopy to signal when operation of the apparatus should be switched from conventional to cyclical plasma etching.

The apparatus may further comprise one or more vacuum pumps for vacuum pumping or purging the process chamber, which act to remove atmospheric air and to provide a suitable low pressure environment for a glow discharge plasma. This is also useful for pumping or purging the process chamber in between the steps of dosing and etching. As explained above, an advantage of removing all of the process gas before the bombardment step is that the likelihood of driving conventional plasma etching or sputtering during etching is reduced. As with conventional plasma etching, it is preferable to pump the process chamber to a pressure below 0.1 Pa before commencing cyclical plasma etching.

An attenuator may be coupled to the second signal generator that allows the second signal generator to operate in use with a first bias power and a second bias power in a sequential manner, the second bias power being attenuated with respect to the first bias power, or vice versa, so as to provide further fine tuning of the bias that is applied to the support that receives the substrate in use. This provides the option of reducing, for example, the full scale power of the second signal generator to allow for more precise control of the energy of the positive ions of the active plasma species that bombard the substrate surface.

In some preferable examples, the first signal generator may be further coupled to an electrostatically screened induction coupled plasma source. Atomic layer etch processes can be very sensitive to the arrival of material sputtered from adjacent surfaces in the process chamber. When ion bombardment energies are held very low, there is no means to remove contaminating material from the surface. If this builds up, the etched surface can become rougher, or in the extreme case etching may cease completely. Where the first signal generator powers an induction coupled plasma (ICP) source, that plasma source preferably incorporates an electrostatic screen, designed to minimise capacitive coupling between the excitation coil and the plasma, while allowing inductive coupling. The electrostatic screen minimises ion bombardment energy at the ICP dielectric wall, and hence minimises unwanted sputtering of involatile species towards the substrate.

The dosing controller of the apparatus for cyclical plasma etching may preferably be a mass flow controller, and said mass flow controller may preferably have time integrating functionality. This means that the mass flow controller can deliver doses of the required order more accurately, especially if a dilute mixture of process gas in background gas is provided to the process chamber for the dosing step. Further, the time integration provides the sum of the flow which is actually delivered irrespective of whether the mass flow controller achieves a stable state.

The apparatus for cyclical plasma etching may further comprise a gas inlet valve close to the chamber, for example a fast acting valve, wherein the process gas flow supply preferably provides an inlet pressure to the valve of less than 1000 Pa, more preferably less than 100 Pa. This is the equivalent to about less than 7.5 Torr and 0.75 Torr respectively. A reservoir volume may be provided just upstream of the gas inlet valve in order to improve the stability of process gas dose delivered when the gas inlet valve is briefly opened. Thus, it is preferable that the gas inlet valve may be opened in use for a controlled period in the range of 5 milliseconds to 500 milliseconds, with a precision of 5 milliseconds, more preferably with a precision of better than 5 milliseconds. Thus, the controller of the apparatus should preferably operate at a resolution of greater than 5 milliseconds and more preferably at greater than 1 millisecond.

In one example, an upstream pressure of 500 Pa gives a peak pressure rise in a 50 liter process chamber of order 0.1-1 Pa. The system may have an automatic pressure control valve between the process chamber and the vacuum pump that acts to limit the pressure rise for dose times above about 200 milliseconds. The gas dose calculated from the dose time and the pressure rise is therefore in the range 5-500 Langmuirs. Lower doses are possible by reducing the inlet pressure further.

The apparatus may further comprise a bypass line for bypassing the flow of the process gas around the process chamber, for example to a pumping system, when a sufficient dose of process gas has been delivered to the process chamber. Thus, when the dosage controller indicates that a sufficient dose of process gas, which may be up to 1000 Langmuirs or alternatively up to 100 Langmuirs or alternatively up to 10 Langmuirs or alternatively up to 1 Langmuir (each controllable within an accuracy of 1 Langmuir), has been delivered to the process chamber for the dosing step, the apparatus may be configured to direct any further process gas away from the process chamber and through the bypass line. Without the bypass line, the dosage controller should be shut off when a sufficient dose of process gas has been delivered to the process chamber. Accordingly, the inclusion of a bypass line to the apparatus permits the dosage controller to reach a steady state in its operation without the need for constant switching on and off. If a mass flow controller with integrating functionality is used as the dosage controller, it becomes less important for the mass flow controller to reach a steady state; however, the bypass line is still useful for accurate control of dose of the process gas.

The apparatus may also further comprise one or more automatic matching units coupled to the first signal generator and/or the second signal generator. The automatic matching unit(s) ensures that the impedance between the input and output of the signal generator is matched so as to avoid signal reflections, thus improving the efficiency of the apparatus.

The apparatus may also further comprise a measurement device such as an optical emission spectrometer for detecting when a specific gas species (process gas and/or background gas) has been removed from the process chamber. This way, any delay between the dosing and bombardment steps can be minimised, thus keeping the cycle time as low as possible.

In accordance with a second aspect of the present invention, there is provided a method for cyclical plasma etching of a substrate that is received on a support within a process chamber in use, the method comprising a plurality of cycles that are effected by a controller, each cycle comprising the steps of: dosing a process chamber with a process gas via a dosing controller such that the substrate is exposed to a maximum dose of process gas of 1000 Langmuirs and said dose is controllable within an accuracy of 1 Langmuir; and operating a first signal generator that is coupled to the process chamber and operating a second signal generator that is coupled to the support within the process chamber so as to cause bombardment of the substrate with positive ions from a plasma active species within the process chamber, wherein the energy of the positive ions of the plasma active species is in the range of 10 eV to 100 eV which is controllable within an accuracy of 5 eV.

The method for cyclical plasma etching may be performed by the apparatus as described above, and the advantages of each feature of the apparatus as described above equally apply to the method steps when said method steps are performed by said apparatus.

The method may further comprise any of the followings steps either taken alone or in combination:
  operating the first signal generator that is coupled to the process chamber so as to generate a plasma active species comprising positive ions;
  operating the second signal generator that is coupled to the support within the process chamber to apply a bias on the support;
  vacuum pumping or purging the process chamber, preferably in between the steps of dosing and operating the first and second signal generators;
  time integrating the plasma active species using a mass flow controller prior to introducing the plasma active species to the process chamber;

operating an attenuator that is coupled to the second signal generator so as to allow the second signal generator to operate in use with a first bias power and a second bias power in a sequential manner, the second bias power being attenuated with respect to the first bias power, or vice versa;

providing an inlet pressure to a gas inlet valve of less than 1000 Pa, more preferably less than 100 Pa using a gas inlet valve that is close to the process chamber;

opening the gas inlet valve in use for a controlled period in the range of 5 milliseconds to 500 milliseconds, more preferably for less than 5 milliseconds, with a precision of 5 milliseconds, more preferably with a precision of better than 5 milliseconds;

operating the controller of the apparatus at a resolution of greater than 5 milliseconds and more preferably at greater than 1 millisecond;

bypassing the flow of process gas around the process chamber; and/or automatically matching the power at the input and the output of the first radio frequency generator and/or the second radio frequency generator using one or more automatic matching units.

monitoring optical emission of a gas species present in the process chamber and controlling a length of delay between the dosing step and the bombardment step based on said optical emission and preferably generating an output signal, which may be an alarm signal, if the monitored optical emission of a gas species present in the process chamber exceeds a predetermined light intensity.

introducing a conditioning plasma in the process chamber before performing the plurality of cycles of dosing and bombardment.

The step of introducing a conditioning plasma run in the process chamber before loading the substrate and before performing the plurality of cycles of dosing and bombardment and can minimise the tendency of some chemical species to build up in the chamber, cycle by cycle. Specifically, an oxygen plasma run in an aluminium chamber may greatly reduce the cumulative build-up of chlorine species in a cyclical process using a chlorinated gas dose.

BRIEF DESCRIPTION OF THE DRAWINGS

Certain preferred embodiments of the present invention will now be described by way of example only with reference to the accompanying drawings, in which:

FIG. 5 is a graph showing a comparison of $SiO_2$ etch rates with and without a $CHF_3$ gas dose; and FIG. 6 is a process flow diagram in accordance with an exemplary embodiment of the present invention.

DETAILED DESCRIPTION OF THE DRAWINGS

Figure 1:
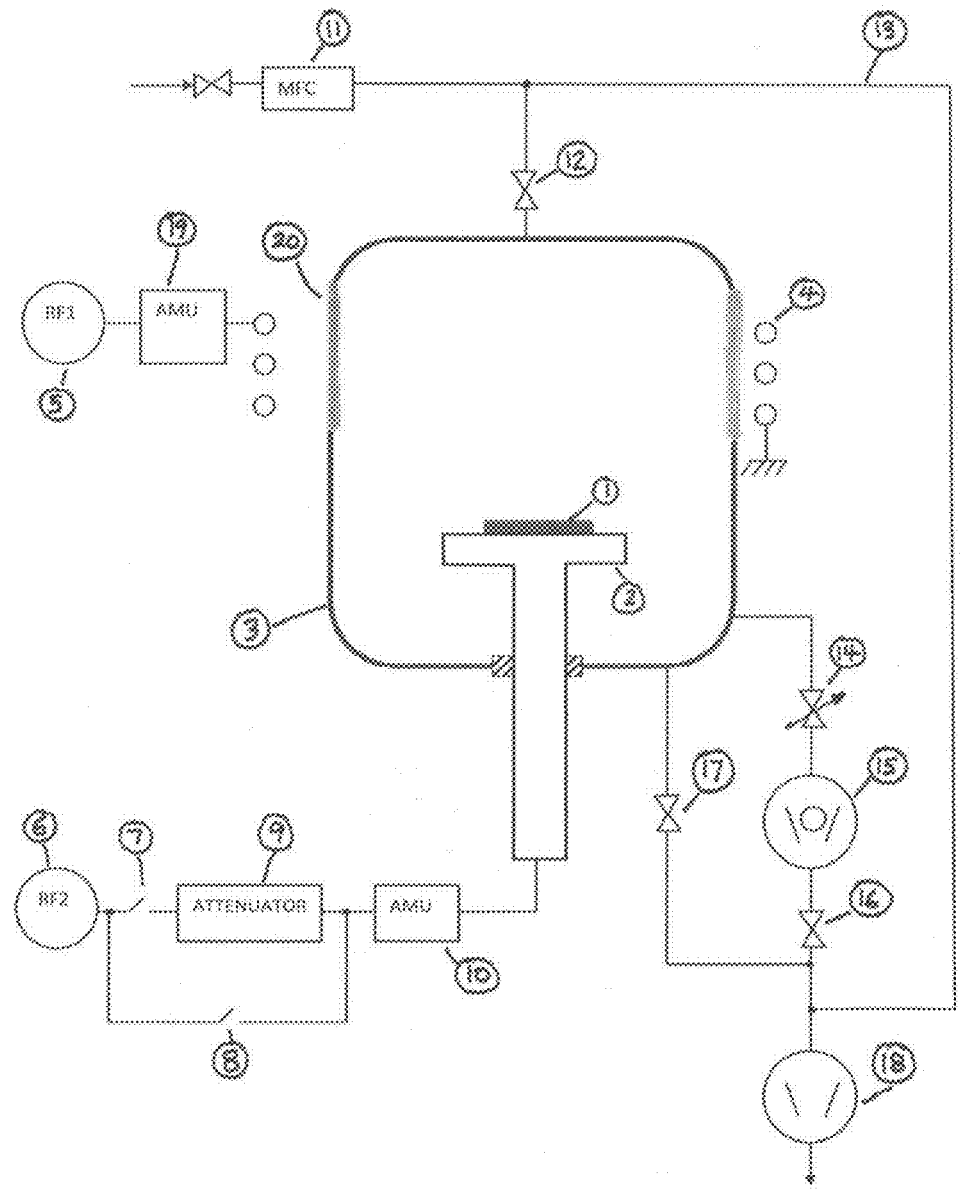
FIG. 1 is a schematic diagram of an apparatus in accordance with an exemplary embodiment of the present invention.

FIG. 1 illustrates a schematic representation of an apparatus for cyclical plasma etching in accordance with an example of the present invention, which is controlled by a controller (not shown) for repeatedly applying a dosing step and a bombardment step respectively. As shown in FIG. 1, a substrate 1 to be etched is placed on a table or support 2 in process chamber 3, which may be a vacuum process chamber. A mass flow controller 11 controls the flow of process gas in the dosing step so that for example 1000 Langmuirs of process gas is introduced into the process chamber at each dosing step.

The process chamber 3 is equipped with a separate source of plasma excitation which is depicted by an induction coupled plasma coil 4 driven by a first RF signal generator 5 and automatic matching unit 19. RF power couples inductively to the plasma in the process chamber through an insulating portion 20 of the process chamber. The first RF signal generator 5 may be a conventional 2 MHz supply having a plasma source power up to 3000 W.

The support 2 is coupled to a second RF signal generator 6 via two alternative paths. The first path, via switch 7 and attenuator 9, is suitable for low power excitation with very precise control of the RF power that is generated. The second path bypasses attenuator 9 and feeds RF power directly to the support 2 via switch 8. Both paths deliver power to the support via automatic matching unit 10. The second path, i.e. the direct path via switch 8, also allows the apparatus to be used for conventional plasma etching in a single recipe, for example, for performing rapid conventional etching through the majority of the thickness of a layer before more precise cyclical etching can be performed via switch 7 and attenuator 9 towards the approach to an interface in the substrate. A measurement device such as an optical emission spectrometer, ellipsometer, or laser interferometer may be used to detect when a critical interface is being reached, thus allowing the etch recipe to be moved on to the cyclical method.

In an example of the present invention where attenuator 9 is not present in the apparatus, the second RF signal generator that provides the bias on support 2 may comprise internal means for changing its first bias power or full scale output power to give the equivalent high resolution control of bias power, or alternatively, two different bias generators can be fitted with switching or mutual protection, one for high power conventional etching, and the other for low power precision etching. In any case, the second RF signal generator may have a high power regime (or first bias power) providing a DC self-bias at the substrate of greater than 50 eV and a low power regime (or second bias power) of 10 eV, for example.

The DC bias of support 2 may preferably be measured directly and then the RF power delivery of the second RF signal generator 6 may be adjusted in order to control the DC bias that is applied rather than by controlling the input power of the second RF signal generator 6. The plasma potential near support 2 may preferably be measured for each cycle immediately before the bombardment step. Advantageously, the plasma potential that is local to the substrate 1 can be measured by applying a swept positive-going voltage pulse to the substrate support 2, where an area of the support 2 of at least 1 $cm^2$ adjacent to the substrate is in direct electrical contact with the plasma. If a reliable DC bias reading cannot be obtained, for example due to the presence of insulating layers on the support 2, then control of the peak-to-peak amplitude of the RF bias signal (or of the power) measured at the output of the automatic matching unit may be used. By using a feedback of actual DC bias, it is possible to control the DC bias to an accuracy of within ±1V. The potential that is described here is defined with reference to the grounded wall of the process chamber 3. However, the DC self-bias that is induced by an oscillating bias potential on an electrode is conventionally referred to as a positive quantity where in fact it is normally negative with respect to the process chamber 3.

The actual ion bombardment energy that is achieved in the bombardment step is approximately the sum of the plasma potential and the DC offset of the support 2. Control of the ion bombardment energy within an accuracy of 5 eV is achieved by measuring both the DC bias of the support 2 and the plasma potential and controlling the bias power to bring the sum of these two readings to a specified control value. The bias excitation frequency can be selected to minimise the spread of ion energy due to ions arriving at the plasma sheath edge at various times in the cycle.

Referring back to FIG. 1, mass flow controller 11 sets the gas flow to the process chamber 3 via fast acting valve 12, which is situated close to the inlet of the process chamber 3, and the mass flow controller 11 can be distant from the process chamber 3 and may be situated, for example, in a conventional gas box.

Bypass line or pipe 13 provides a bypass around the process chamber 3 and enters the pumping path between turbo molecular pump 15 and primary vacuum pump 18. An automatic pressure control valve 14, backing valve 16 and roughing valve 17 make up the remainder of the pumping system. Pressure gauges and means for loading the substrate may be included in the apparatus but these components are not shown in FIG. 1. The flow control of background gas is also not shown. This may enter/originate in a conventional gas flow control box and enter the process chamber upstream of the plasma source. It can optionally use a similar close-coupled valve and bypass line as used with the process gas, if it is desired to interrupt the flow of background gas, for example in a pump down step.

Preferably a reservoir volume (not shown) can be provided in the line just before the fast acting valve 12 in order to improve the stability of the upstream pressure during the process gas dose. The impedance of the bypass line 13 should be selected to produce a suitable inlet pressure of the fast acting valve 12, preferably in the range 100 to 1000 Pa, with the chosen steady gas flow. Alternatively, a low impedance path 13 can be provided with a control element such as a settable variable valve which is included in the bypass line 13.

Figure 2:
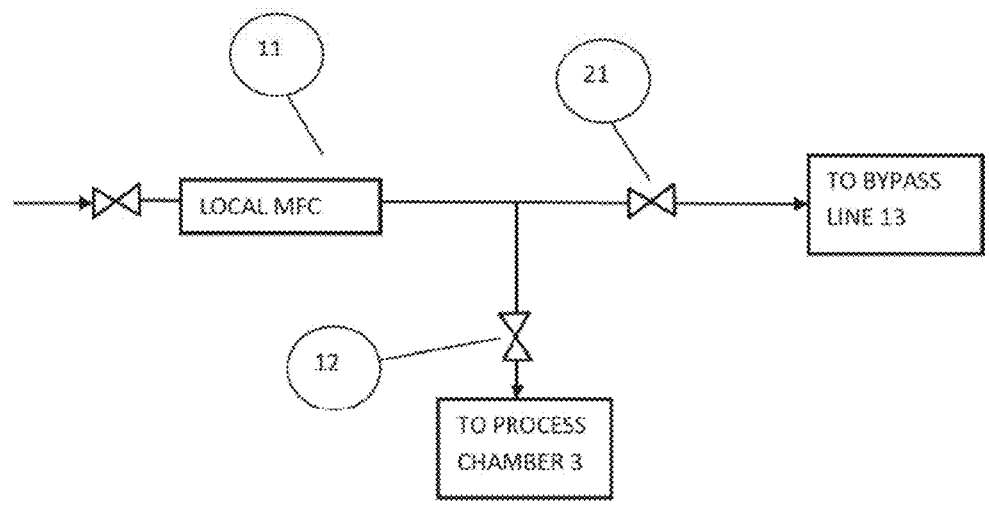
FIG. 2 is a schematic diagram of part of an apparatus in accordance with an exemplary embodiment of the present invention.

Now referring to FIG. 2, a preferred arrangement of the apparatus for cyclical plasma etching is shown with the mass flow controller 11 being brought closer to the process chamber (not shown in FIG. 2) and having time integrating functionality such that the delivered dose to the process chamber is defined rather than a steady flow of process gas. In this arrangement, the bypass line may be omitted since the mass flow controller 11 shuts off when a sufficient dose of process gas has been delivered to the process chamber; however, the bypass line may be included if a significant dose of process gas could still be delivered to the process chamber after the mass flow controller 11 has nominally been switched off. After a sufficient dose of process gas has been delivered to the process chamber via valve 12, the bypass pumping valve 21 is opened to prevent an unintended gas build-up downstream of the mass flow controller 11.

Figure 3:
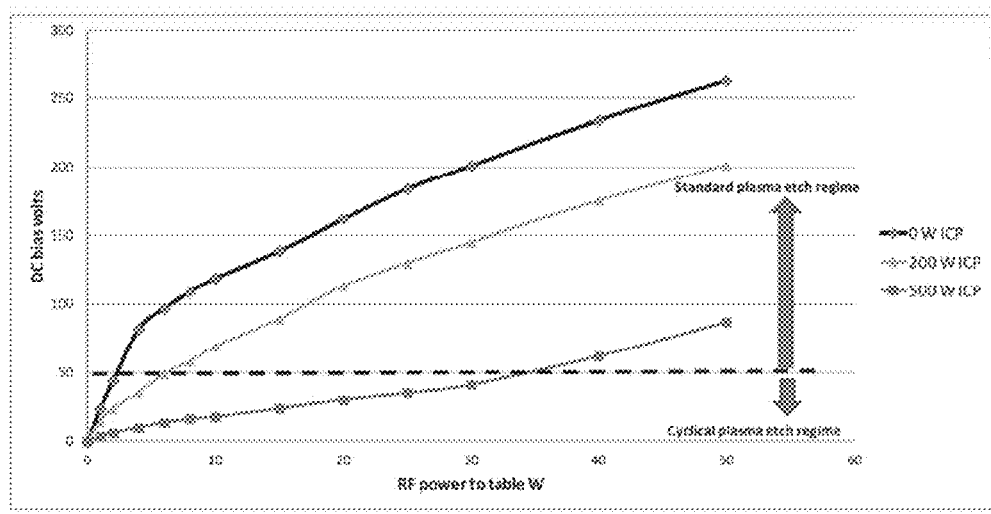
FIG. 3 is a graph showing the relationship between RF power applied to a support and the DC bias that is developed for various plasma regimes.

FIG. 3 is a graph that shows the DC bias that is developed at a support of a representative 200 mm apparatus for cyclical plasma etching with varying RF power applied to the support, in accordance with an example of the present invention. The apparatus used to obtain the graph of FIG. 3 is a PlasmaPro etcher from Oxford Instruments plc, UK, equipped with a 300 mm bore 2 MHz Cobra plasma source, and may be illustrated schematically by, for example, the diagram of FIG. 1. To characterise the system, RF powers of 0 W, 200 W and 500 W are applied to the plasma source and bias powers between 0 W and 50 W at 13.56 MHz. It can be seen by comparing the graph of FIG. 3 with the plasma etch results of FIGS. 4 and 5, that the cyclical plasma etch regimes exists below 50V DC bias on the support, and the standard plasma etch regime exists above 50V DC bias on the support. To stay in the required etch regime, it is preferable to measure the DC bias, and not just regulate the bias power, because the DC bias depends on the power level of both first and second signal generators. The plasma source power is preferably maintained at a level needed to sustain the plasma throughout the cycle, and the bias power applied only during the bombardment step.

Figure 4:
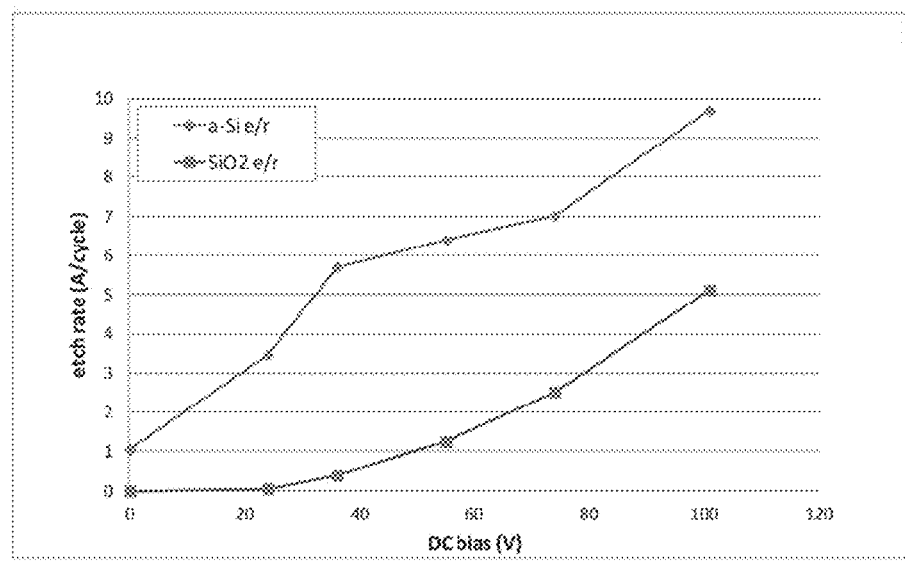
FIG. 4 is a graph showing a comparison of Si and $SiO_2$ etch rates during a bombardment cycle.

FIG. 4 is a graph that shows the etch rates of amorphous silicon and of silicon dioxide in Angstroms per cycle using a cyclical etch method for varied DC biases applied to the substrate support by varying the RF power to the support in the bombardment step, in accordance with an example of the present invention. The etch rates may be measured, for example, by ellipsometry. A plurality of cycles, for example three cycles, is applied, each cycle comprising:

a dosing step comprising dosing the process chamber with 0.15 standard cubic centimeters of chlorine process gas over two seconds;

a pumping/purging step comprising vacuum pumping the process chamber for eight seconds; and a bombardment step comprising operating the first and second RF signal generators In the above cycle, a steady flow of 100 standard cubic centimeters of argon background gas and an inductively coupled plasma power of 500 W are maintained throughout. The pressure used is 10 mTorr. The adsorbing species is most likely to be atomic chlorine, not molecular chlorine, with a partial pressure of order 1-10% of the molecular gas. This equates to a dose in the range 10-1000 Langmuirs, taking steady state calculated values as the limiting partial pressures.

As shown in FIG. 4, the regime where silicon is etched while silicon dioxide is not etched is limited to DC bias values below 20V, which is equivalent to bias powers in the range 1-5 W, depending on the plasma source power used. Above 20V DC bias, silicon dioxide begins to be etched as well. Between 35-75V DC bias, the etch rate of silicon plateaus after an initial monolayer has been removed. Then, at around 75V DC bias, sputtering takes over chemical etching and the etch rate for both silicon and silicon dioxide increases significantly.

For an etch rate reproducible to better than ±1%, the bias power must be controlled within an accuracy of 0.1 W and the bombarding species energy must be controlled within an accuracy of 5 eV. Such a degree of accuracy is not readily achievable using conventional power delivery schemes, however, an attenuator that is coupled to the second signal generator (for example, attenuator 9 as shown in FIG. 1), may be used in order to achieve this. For example, a 20 dB attenuator arranged between the second signal generator and the automatic matching unit changes the power of the second signal generator from 300 W full scale (first bias power) to 30 W full scale (second bias power). The nominal working point of 1 W is then around 3% of full scale power, at which point conventional generators are normally still in a linear working regime. A 0.1 W increment in power is an increase of 0.3% of full scale, again within the possibility of a conventional control system.

The second signal generator (or bias generator) and attenuator should be chosen such that the desired working range of DC bias is accessible with reproducibility of $5V_{DC}$ or better. Multiple switched attenuators could be used if additional ranges of full scale power are required. Table power control can use either generator power, measured power after the automatic matching unit, control of DC bias, or control of peak-to-peak voltage at the output of the automatic matching unit. The control resolution should be better than 0.1 W or $5V_{DC}$ or 10V peak-to-peak, depending on the measurement method that is selected, and preferably better than $1V_{DC}$ or 2V peak-to-peak.

FIG. 5 is a graph that shows another example cyclical plasma etching process where silicon dioxide is etched with and without fluoroform ($CHF_3$). The process conditions are the same as that used for producing the graph of FIG. 4, except $CHF_3$ is used instead of chlorine during the dosing step. Here, it is believed that $CHF_3$ is partially decomposed in the plasma, depositing a thin layer of fluorocarbon polymer on the substrate surface, which then acts as a restricted reservoir of etch species during the bombardment step that follows. The self-limiting behaviour of the process is shown by the plateau region between about 20-50V of DC bias during the bombardment step, where increases in ion energy do not increase the etch rate per cycle. The role of the chemical dose of the $CHF_3$ dose is demonstrated in comparison to the very low etch rate when no $CHF_3$ process gas is used and only argon background gas is used. The need for precise control of low DC bias powers is shown by the upturn in etch rate above 50V DC bias, when conventional plasma etching occurs and thus increases the etch rate.

The need to reduce the etch dose of process gas as low as possible is demonstrated by the non-zero etch rate even at low ion energies with no additional $CHF_3$ process gas dosing. Even if the substrate displays a self-limiting behaviour for the adsorption of an active etch species, the process chamber may not allow for such behaviour. For example, overdosing the chamber can lead to the chamber walls and furniture becoming significant reservoirs of etch species, which will continue to drive etching long after the dosing step has ended.

Further precision and reproducibility can be obtained by using an analysis technique such as optical emission spectroscopy to determine if the chamber is clear of etch species. This can then be used to determine the length of the pumping/purging step between the dosing and bombardments steps, or to flag the need for more thorough process chamber cleaning. By monitoring the intensity of light emitted by an active chemical species, it is possible to determine when sufficient delay has passed between the dosing step and the bombardment step. Also by monitoring the intensity of light emitted by an active chemical species, it is possible to determine if the species is tending to build up cumulatively in the chamber, for example, by adsorption to the chamber walls.

Now turning to the flow chart of FIG. 6, the process steps of a method for cyclical plasma etching in accordance with a preferred exemplary embodiment of the present invention is shown. The process steps will be described in some further detail below:

S61: The substrate to be etched is loaded to the substrate support in the process chamber;

S62: The process chamber is pumped to a pressure below 0.1 Pa;

S63: Flow of inert background gas, preferably argon, is initiated into the process chamber;

S64: Plasma is generated from the background gas using a first signal generator;

S65: Process gas is introduced into the process chamber in a dosing step such that the substrate is exposed to a maximum dose of process gas in use of 1000 Langmuirs and said dose is controllable within an accuracy of 1 Langmuir;

S66: The process is vacuum pumped/purged (optional);

S67: The plasma potential is measured (optional);

S68: Control of the second signal generator allows the substrate to be bombarded with positive ions from the plasma active species with a peak ion energy in the range 20-50 eV, which is controllable within an accuracy of 1 eV;

S69: The ion bombardment peak energy is reduced to below 20 eV; and

S70: If the etching is complete, the process ends. If the etching is not complete, the cycle reverts back to step S65.

Variants of the above process steps are possible, for example, the plasma may be generated from the process gas or a mixture of the process gas and the background gas. In the process flow diagram of FIG. 6, the first signal generator is continuously powered on so that the plasma is kept on continuously, which advantageously results in no major changes in plasma source power or working pressure. However, alternatively, the first signal generator may be switched on and off in each cycle so as to generate the plasma intermittently.

It will be appreciated that although some of the examples of the present invention described above refer to preferred embodiments, the principles of these examples may be applied to all aspects and embodiments of the present invention, including those defined in any of the claims. Furthermore, features that are described in the context of separate embodiments may be provided in combination in a single embodiment, and conversely, features that are described in the context of a single embodiment may also be provided separately or in any suitable sub-combination.

The invention claimed is:

1. A method for cyclical plasma etching of a substrate that is received on a support within a process chamber in use, the method comprising a plurality of cycles that are effected by a controller, each cycle comprising the steps of:
   dosing a process chamber with a process gas via a dosing controller such that the substrate is exposed to a maximum dose of process gas of 1000 Langmuirs and said dose is controllable within an accuracy of 1 Langmuir; and
   operating a first signal generator that is coupled to the process chamber and operating a second signal generator that is coupled to the support within the process chamber so as to cause bombardment of the substrate with positive ions from a plasma active species within the process chamber, wherein the substrate bombardment energy of the positive ions of the plasma active species is in the range of 10 eV to 100 eV which is controllable within an accuracy of 5 eV,
   wherein the method further comprises the step of vacuum pumping or purging the process chamber in between the steps of dosing and operating the first and second signal generators.

2. A method according to claim 1, wherein the method further comprises providing an inlet pressure to the process chamber of less than 1000 Pa, more preferably less than 100 Pa, using a gas inlet valve close to the process chamber.

3. A method according to claim 1, wherein the method further comprises bypassing the flow of process gas around the process chamber.

4. A method according to claim 1, wherein the process gas is one or more gases selected from the group consisting of: bromine, hydrogen bromide, chlorine, hydrogen chloride, fluoroform and other volatile fluorocarbon compounds.

5. A method according to claim 1, wherein the method further comprises monitoring optical emission of a gas species present in the process chamber and controlling a length of delay between the dosing step and the bombardment step based on said optical emission.

6. A method according to claim 5, wherein the method further comprises generating an output signal if the monitored optical emission of a gas species present in the process chamber exceeds a predetermined light intensity.

7. A method according to claim 1, wherein the method further comprises introducing a conditioning plasma in the process chamber before performing the plurality of cycles of dosing and bombardment.

8. A method according to claim 1, wherein the method further comprises operating an attenuator that is coupled to the second signal generator so as to allow the second signal generator to operate in use with a first bias power and a second bias power in a sequential manner, the second bias power being attenuated with respect to the first bias power, or vice versa.

9. A method according to claim 8, wherein the first bias power is at least 300 W and the second bias power is below 10 W.

\* \* \* \* \*